(12) United States Patent
Hao et al.

(10) Patent No.: US 11,382,222 B2
(45) Date of Patent: Jul. 5, 2022

(54) LED DISPLAY PANEL

(71) Applicant: SHENZHEN INFILED ELECTRONICS CO., LTD, Shenzhen (CN)

(72) Inventors: Zongchao Hao, Shenzhen (CN); Qiuhe Liu, Shenzhen (CN); Wentao Wei, Shenzhen (CN)

(73) Assignee: SHENZHEN INFILED ELECTRONICS CO., LTD, Shenzhen (CN)

( * ) Notice: Subject to any disclaimer, the term of this patent is extended or adjusted under 35 U.S.C. 154(b) by 0 days.

(21) Appl. No.: 17/049,968

(22) PCT Filed: Nov. 13, 2019

(86) PCT No.: PCT/CN2019/117901
§ 371 (c)(1),
(2) Date: Oct. 23, 2020

(87) PCT Pub. No.: WO2021/072867
PCT Pub. Date: Apr. 22, 2021

(65) Prior Publication Data
US 2021/0378111 A1 Dec. 2, 2021

(30) Foreign Application Priority Data
Oct. 18, 2019 (CN) .......................... 201910993354.3

(51) Int. Cl.
*H05K 7/02* (2006.01)
*H05K 7/04* (2006.01)
(Continued)

(52) U.S. Cl.
CPC ......... *H05K 5/0021* (2013.01); *G09F 9/3026* (2013.01); *G09F 9/33* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 7,869,198 B1 * | 1/2011 | Nearman | G06F 1/1601 361/679.01 |
| 2019/0179592 A1 * | 6/2019 | Hyeon | G06F 3/1446 |
| 2020/0211426 A1 * | 7/2020 | Tian | H01R 13/187 |

FOREIGN PATENT DOCUMENTS

| | | |
|---|---|---|
| CN | 203457445 U | 2/2014 |
| CN | 204145954 U | 2/2015 |

(Continued)

*Primary Examiner* — Hung S. Bui
(74) *Attorney, Agent, or Firm* — Bayramoglu Law Offices LLC

(57) ABSTRACT

An LED display panel includes main frame made of a lightweight material, a supporting component and a control box. The main frame includes a first end surface for mounting a display screen and a second end surface opposing the first end surface. The supporting component includes a supporting tube and a plurality of supporting members. Fixing parts are arranged on peripheral edges of the second end surface, and the plurality of supporting members are correspondingly mounted on the fixing parts. A tube fixing part is arranged on an end of the supporting member far away from the second end surface, and the supporting tube is fixed on the tube fixing part. A power supply, a control system and a signal transmission system are arranged in the control box, and the control system and the signal transmission system are electrically connected to the power supply.

13 Claims, 11 Drawing Sheets

(51) Int. Cl.
  *H05K 5/00*    (2006.01)
  *G09F 9/302*   (2006.01)
  *G09F 9/33*    (2006.01)
  *H05K 5/02*    (2006.01)
(52) U.S. Cl.
  CPC ........... *H05K 5/0017* (2013.01); *H05K 5/023* (2013.01); *H05K 5/0221* (2013.01)

(56) References Cited

FOREIGN PATENT DOCUMENTS

| | | | | |
|---|---|---|---|---|
| CN | 204332282 U | 5/2015 | | |
| CN | 105869536 A | 8/2016 | | |
| CN | 205722647 U | 11/2016 | | |
| CN | 108386662 A | 8/2018 | | |
| CN | 208444540 U | 1/2019 | | |
| CN | 109473797 | * 3/2019 | ............... | G09F 9/23 |
| DE | 3635352 A1 | 7/1987 | | |
| FR | 2684641 A1 | 6/1993 | | |

* cited by examiner

LED DISPLAY PANEL

CROSS REFERENCE TO THE RELATED APPLICATIONS

This application is the national phase entry of International Application No. PCT/CN2019/117901, filed on Nov. 13, 2019, which is based upon and claims priority to Chinese Patent Application No. 201910993354.3, filed on Oct. 18, 2019, the entire contents of which are incorporated herein by reference.

TECHNICAL FIELD

The present invention relates to the technical field of a light emitting diode (LED) display apparatus, and more particularly, to an LED display panel.

BACKGROUND

LED display technology continuously develops and progresses in all types of applications. In the recent years, LED display screen has been widely applied in music performances, live broadcasting and events.

To facilitate transportation, LED display screens are usually divided into several small panel structures, each small panel is typically made into a cuboid to facilitate splicing. However, the overall weight of the small panel that are currently available in the market and known to the industry is relatively heavy. When a large display screen needs to be installed, the transpiration and splicing of the screen require intense labor because of the heavy weighted panel, which is very inconvenient.

SUMMARY

The present invention provides an LED display panel that is simple in structure, easy to produce, light in weight, convenient for subsequent transportation, splicing and maintenance, etc., and has a great application value in the market.

The present invention provides an LED display panel, including: a main frame made of a lightweight material, wherein the main frame includes a first end surface for mounting a display screen and a second end surface opposing the first end surface;

a supporting component, wherein the supporting component includes a supporting tube and a plurality of supporting members; fixing parts are arranged on peripheral edges of the second end surface, and the plurality of supporting members are correspondingly mounted on the fixing parts; a tube fixing part is arranged on an end of the supporting member far away from the second end surface, and the supporting tube is fixed on the tube fixing part; and a control box, wherein a power supply, a control system and a signal transmission system are arranged in the control box, and the control system and the signal transmission system are electrically connected to the power supply; and the control box is mounted on the second end surface.

According to the display panel of the present invention, the main frame includes frame rods arranged on the periphery of the main frame and supporting rods arranged inside the main frame. The frame rods and the supporting rods are integratedly molded by using a magnesium alloy material.

According to the display panel of the present invention, the frame rods and/or the supporting rods are provided with a plurality of notches for reducing a mass; and/or, edges of the notches of the frame rods and/or the supporting rods are connected to a plurality of reinforcing ribs.

According to the display panel of the present invention, the number of the supporting rods is two, and the two supporting rods are arranged in a cross shape inside the main frame.

According to the display panel of the present invention, the supporting member is injection-molded by using a polypropylene (PP) plastic and has a hollow structure, and/or the supporting tube includes a carbon fiber tube made of a carbon fiber material.

According to the display panel of the present invention, the supporting member includes a first supporting member and a second supporting member. The first supporting member is clamped on a corner of the frame rods, and the second supporting member is mounted on the middle portion of the frame rod.

According to the display panel of the present invention, the tube fixing part includes a first tube fixing part and a second tube fixing part, and the first fixing part and the second tube fixing part are perpendicularly arranged on two adjacent sides of the first supporting member.

According to the display panel of the present invention, the tube fixing part further includes a tube fixing hole, and the tube fixing hole is arranged on the second supporting member. The number of the supporting tubes is four, and the four supporting tubes penetrate through the tube fixing hole. Both ends of the supporting tube are fixed on the first tube fixing part and the second tube fixing part, respectively.

According to the display panel of the present invention, a lock fixing component is arranged on the control box, and the lock fixing component includes a female socket and a male plug. The male plug is mounted on the control box, and the female socket is mounted on the main frame.

According to the display panel of the present invention, the female socket is provided with a spiral track groove, and the male plug is provided with a latch cooperating with the tack groove. When the control box is mounted on the main frame, the latch moves along the track groove and is clamped in the track groove.

According to the display panel of the present invention, the track groove includes a starting segment, a connection segment and an ending segment. The starting segment is arranged along an axial direction of the female socket, the ending segment is parallel to an end surface of the female socket, and the connection segment is connected between the starting segment and the ending segment.

According to the display panel of the present invention, a clamping platform is arranged at a connection portion of the connection segment and the ending segment to enable the latch to be clamped between an end of the ending segment far away from the clamping platform and the clamping platform.

According to the display panel of the present invention, the control box includes:

a box body, wherein the box body includes a cover body and a base. The cover body is provided with a cavity having an opening. The control system and the signal transmission system are mounted in the cavity, and the base covers onto the opening of the cavity; and a power supply component, wherein the power supply component includes a power supply mounting member and a power supply. The power supply is mounted on the power supply mounting member, and the control system and the signal transmission system are electrically connected to the power supply.

Specifically, a power supply component mounting groove is arranged at an end surface of the cover body opposing the opening of the cavity, and the power supply component mounting groove communicates with the cavity. The power supply is detachably mounted in the power supply component mounting groove through the power supply mounting member.

According to the display panel of the present invention, the power supply mounting member includes:

an aluminum substrate, wherein a shape and a size of the aluminum substrate are adapted to a shape and a size of the mounting groove, and the power supply is mounted on the aluminum substrate through a thermal conductive silica gel.

According to the display panel of the present invention, a heat dissipation member is arranged at an end surface of the aluminum substrate opposing the power supply.

According to the display panel of the present invention, the heat dissipation member includes at least two parallel diversion grooves arranged on the aluminum substrate.

According to the display panel of the present invention, a plurality of supporting plates are provided at a position of the cover body, wherein the position corresponds to the the power supply component mounting groove, and the plurality of supporting plates are arranged to cross each other at the lower part of the mounting groove.

According to the display panel of the present invention, a lock fixing part is arranged on the power supply mounting member, a mounting part is arranged on one side of the mounting groove, and a position of the lock fixing part corresponds to a position of the mounting part.

According to the display panel of the present invention, one of the power supply mounting member and the cover body is provided with a clamping notch, the other one of the power supply mounting member and the cover body is provided with a clamping platform, and the clamping platform is engaged with the clamping notch.

According to the display panel of the present invention, an angle adjuster and a lock fastening component are arranged on the main frame, and the angle adjuster and the lock fastening component are mounted on two opposing sides of the main frame, respectively.

According to the display panel of the present invention, the angle adjuster includes a mounting base and an adjusting block, and the adjusting block is mounted on the main frame through the mounting base. The lock fastening component includes a fixing base and a handle component cooperating with the adjusting block, and the handle component is mounted on the main frame through the fixing base. A position of the fixing base corresponds to a position of the mounting base.

According to the display panel of the present invention, the adjusting block includes:

a first side surface, wherein the first side surface is located at one side of the adjusting block and is a quarter arc surface;

a second side surface, wherein the second side surface is located at the other side of the adjusting block and is a quarter arc surface;

a curved surface structure, wherein the curved surface structure is connected between an arc edge of the first side surface and an arc edge of the second side surface; and an end surface structure, wherein the end surface structure is connected between a right-angle side of the first side surface and a right-angle side of the second side surface, and is provided with a connection part cooperating with the handle component.

According to the display panel of the present invention, the mounting base is provided with a movable cavity adapted to the adjusting block. The angle adjuster further includes:

an adjusting handle, wherein the adjusting handle passes through the mounting base and then is connected to the adjusting block mounted in the movable cavity to adjust a rotation angle of the adjusting block relative to the mounting base.

According to the display panel of the present invention, the curved surface structure is provided with a perforation, and the mounting base is provided with an adjusting hole. The adjusting handle includes:

a first lock rod, wherein one end of the first lock rod passes through the adjusting hole and then extends out of the adjusting hole, and the other end of the first lock rod passes through the perforation and then is fixed through a clamping ring; and a first lock handle, wherein the first lock handle is mounted on the end of the first lock rod passing through the adjusting hole to adjust a position of the adjusting block in the movable cavity.

According to the display panel of the present invention, the adjusting hole is formed by sequentially connecting two through holes with different diameters. The first lock rod includes a big end and a small end with diameters matching the two through holes. The first lock rod includes a first end and a second end with diameters matching the two through holes, wherein the first end is larger than the second end. The adjusting handle further includes:

an elastic member, wherein one end of the elastic member abuts against the clamping ring, and the other end of the elastic member abuts against the curved surface structure, so that the big end is clamped on the adjusting hole under an action of the elastic member, and the small end is movable in the adjusting hole under the action of the elastic member.

According to the display panel of the present invention, a pin hole is arranged on both sides of the mounting base, respectively. The angle adjuster further includes:

a positioning pin, wherein the positioning pin passes through the pin hole and is mounted on the adjusting block to enable the adjusting block to rotate along the pin hole through the positioning pin.

According to the display panel of the present invention, the handle component further includes:

a second lock rod, wherein the second lock rod includes a lock rod body and a rotating shaft; the lock rod body penetrates through the rotating shaft, and the rotating shaft is mounted on the main frame through the fixing base; and a second lock handle, wherein the second lock handle is fixedly connected to the lock rod body to drive the lock rod body to move back and forth along an axial direction of the rotating shaft.

According to the display panel of the present invention, the lock rod body includes a screw shaft along the axial direction, the rotating shaft is provided with a screw hole matching the screw shaft, and the screw shaft is rotatably mounted in the screw hole through the second lock handle.

According to the display panel of the present invention, the rotating shaft is provided with a ratchet wheel, the second lock handle is provided with a ratchet pawl, and the ratchet pawl cooperates with the ratchet wheel to limit a rotation direction of the second lock handle.

According to the display panel of the present invention, the second lock handle is further provided with a control member, and the control member is connected to the ratchet pawl to control connection or disconnection of the ratchet pawl and the ratchet wheel.

The technical solution provided by the present invention has the following advantages. The present invention designs an LED display panel, the main frame is made of a lightweight material, and a supporting tube and supporting members are arranged on a second end surface of the main frame. In this way, it is convenient for production and simple in manufacturing process. Moreover, a mass of a frame structure is reduced, while a strength of the frame structure is ensured to facilitate transportation and splicing of the frame structure.

It should be understood that the above general description and the following detail description are merely exemplary and illustrative and are not considered as limitations to the present invention.

BRIEF DESCRIPTION OF THE DRAWINGS

In order to illustrate technical solutions of the embodiments of the present invention clearly, the drawings used in the description of the embodiments will be introduced briefly below. The following described drawings are some of the embodiments of the present invention, and other drawings may be obtained according to these drawings by those having ordinarily skill in the art without any creative effort.

DETAILED DESCRIPTION OF EXEMPLARY EMBODIMENTS

The technical solutions of the embodiments of the present invention are described clearly and completely below in conjunction with the drawings in the embodiments of the present invention. Obviously, the described embodiments are a part of the embodiments of the present invention rather than all the exemplary embodiments. Based on the embodiments of the present invention, all the other embodiments acquired by those having ordinary skill in the art without any creative effort shall fall within the scope of protection of the present invention.

In the description of the present invention, it should be understood that orientations or positional relationships, indicated by terms "center", "longitudinal", "transverse", "length", "width", "thickness", "upward", "downward", "front", "rear", "left", "right", "vertical", "horizontal", "top", "bottom", "in", "out", "clockwise", "anticlockwise" and so on, are orientations and positional relationships shown based on the drawings, merely in order to facilitate the description of the present invention and simplify the description, rather than indicating or implying that the device or element referred to must have a specific orientation and be configured or operated in a specific orientation, and thus cannot be understood as limitations to the present invention. In addition, terms "first" and "second" are merely for descriptive purpose, and thus cannot be understood as indication or implication of relative importance or implicitly indicating the number of the technical feature referred to. Accordingly, a feature defined with "first" or "second" can explicitly or impliedly include one or more the features. In the description of the present invention, the term "a plurality of" means two or more than two, unless there is an explicit and specific definition.

Some of the embodiments of the present invention are illustrated in detail with reference to the drawings. The embodiments as well as the features in the embodiments below can be combined with each other as long as they are not conflict with each other.

The LED display panel of the present invention is related to the technical field of an LED display apparatus. As necessary displaying tool in various fields, the stability and convenience of LED display screens are especially important. The large-screen LED display screens currently available are often difficult to transport due to the large size of the screen body. Typically, the screen body is divided into several small panels that are often made into cuboids in order to facilitate splicing. The single panel in the prior art has a long processing cycle, and is typically heavy and inconvenient to transport, and splice.

Figure 1:
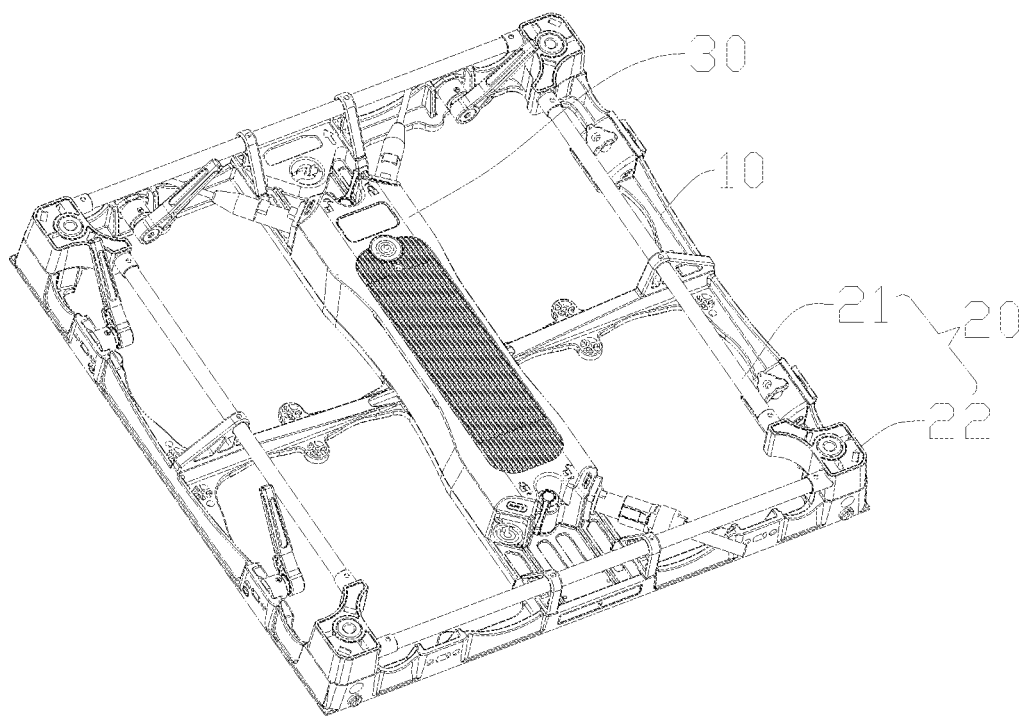
FIG. 1 is a schematic view of the structure of an LED display panel according to an embodiment of the present invention.
Figure 2:
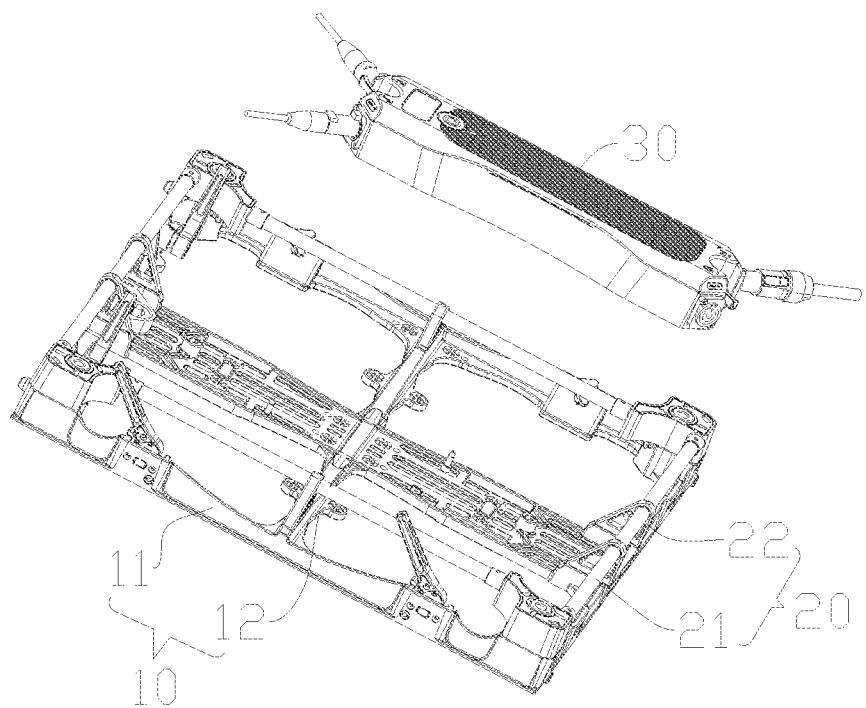
FIG. 2 is an exploded view of the display panel in FIG. 1.
Figure 3:
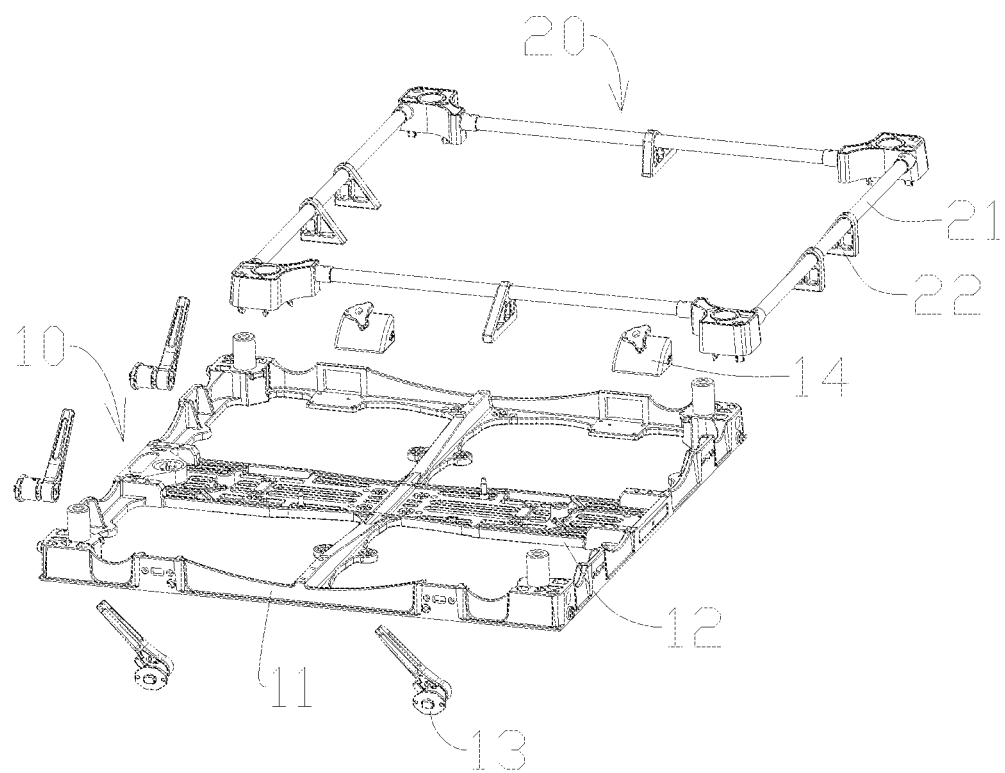
FIG. 3 is an exploded view of a part of the display panel in FIG. 1.
Figure 4:
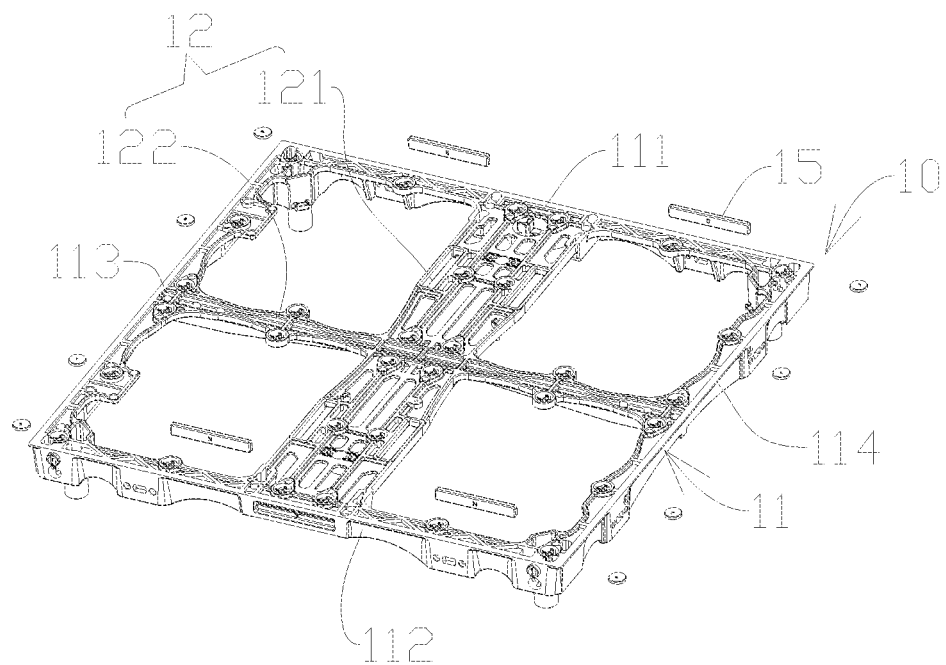
FIG. 4 is an exploded view of a main frame in FIG. 1.
Figure 5:
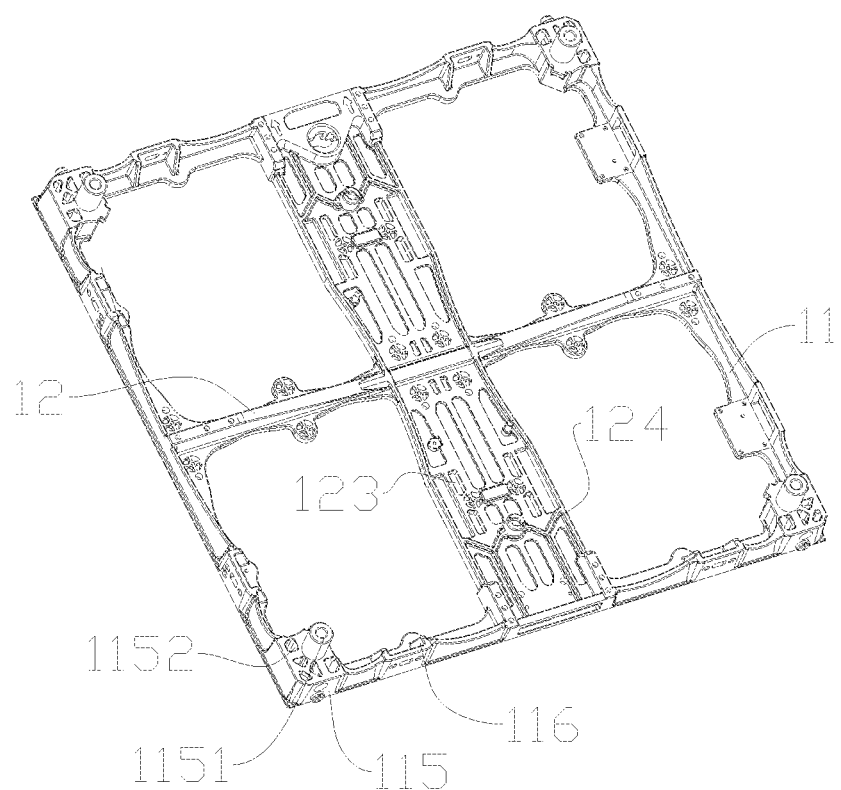
FIG. 5 is a schematic view of the structure of the main frame in FIG. 1.
Figure 6:
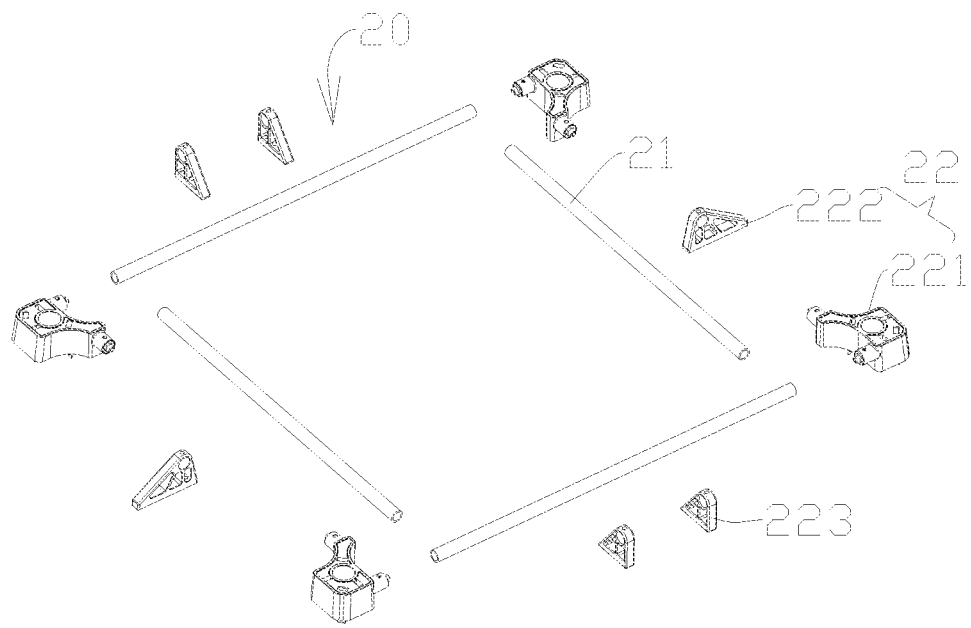
FIG. 6 is an exploded view of a supporting component in FIG. 1.
Figure 7:
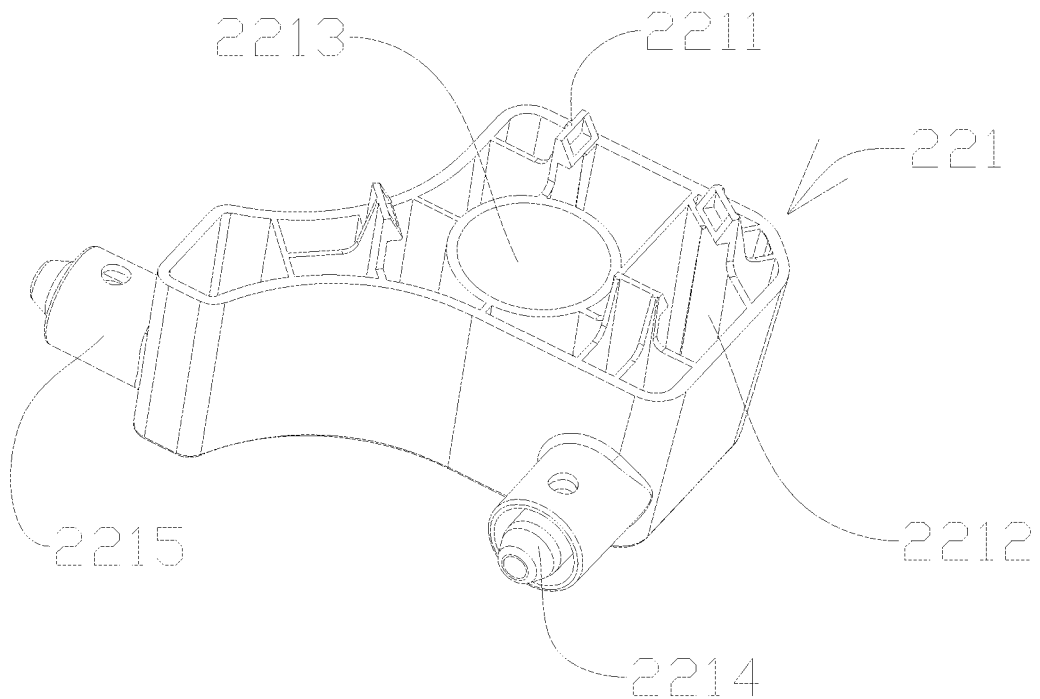
FIG. 7 is a schematic view of the structure of a first supporting member in FIG. 6.
Figure 8:
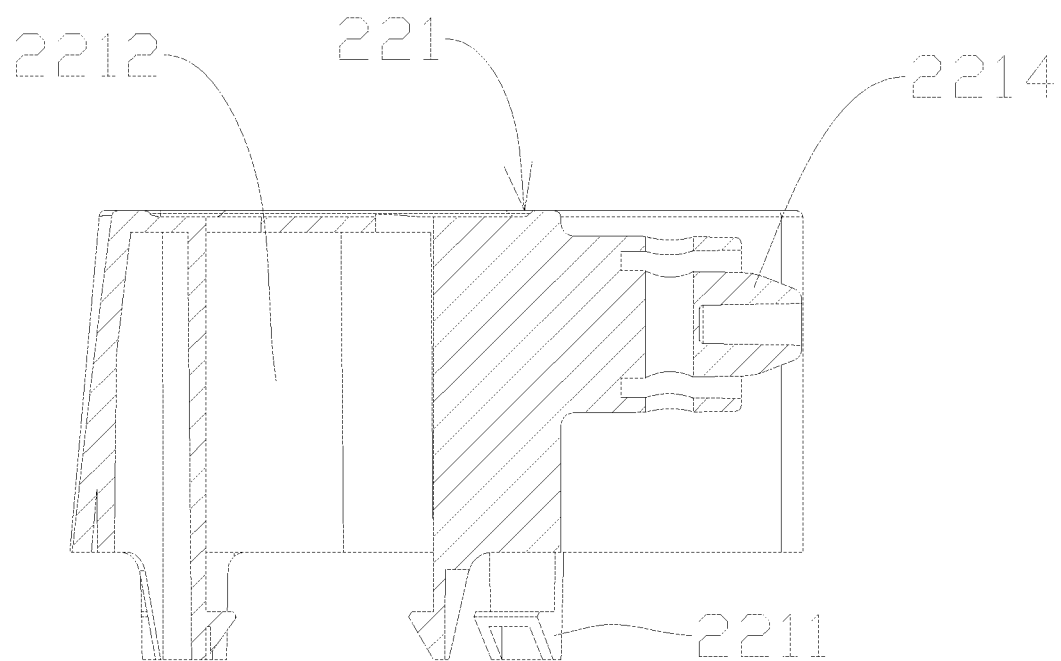
FIG. 8 is a cross-sectional view of the first supporting member in FIG. 6.
Figure 9:
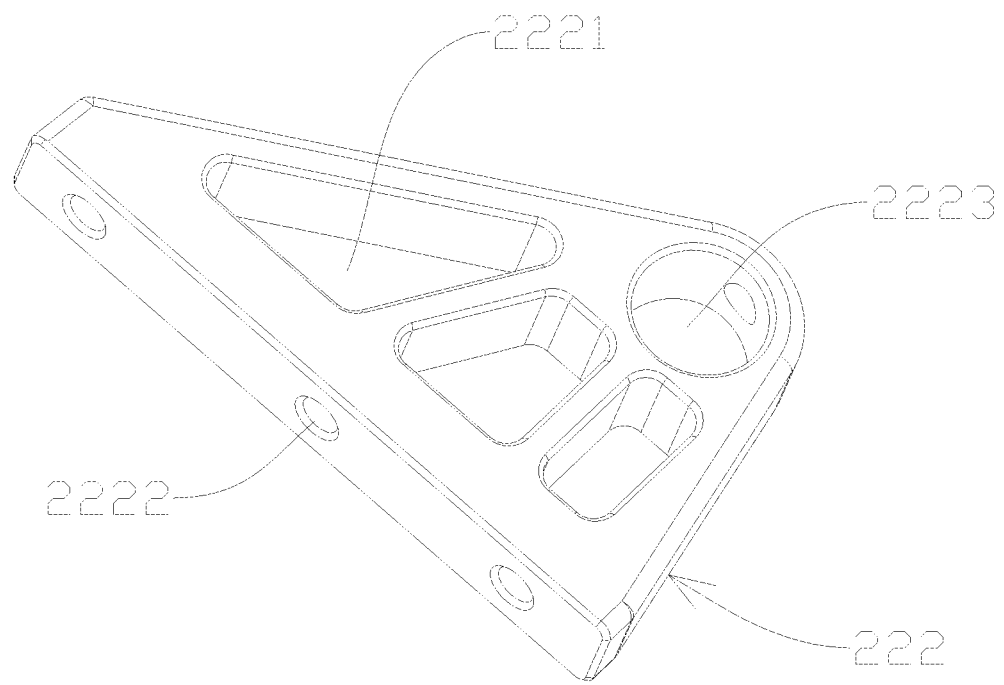
FIG. 9 is a schematic view of the structure of a second supporting member in FIG. 6.
Figure 10:
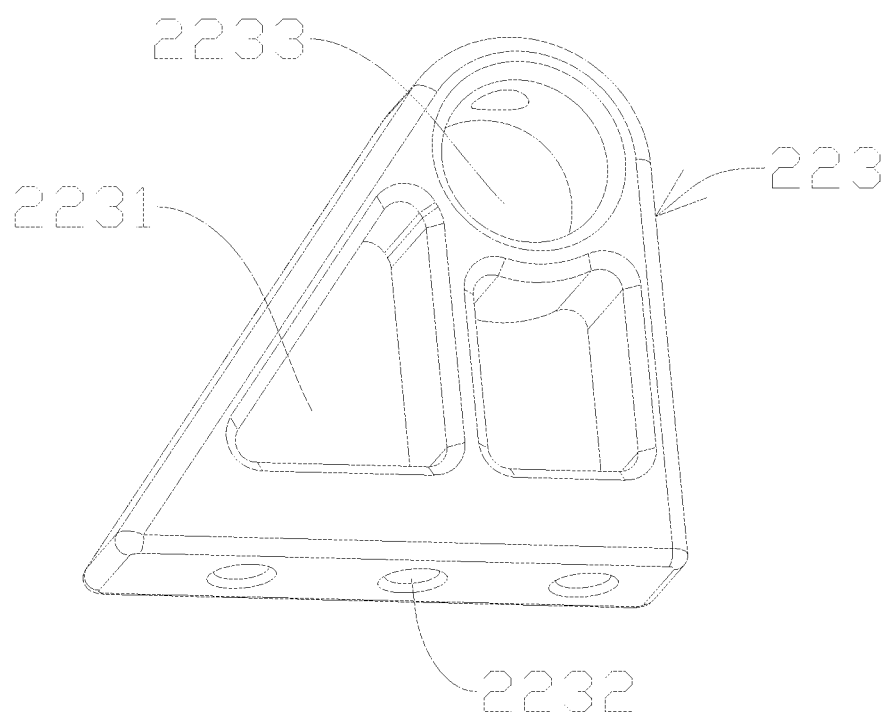
FIG. 10 is a schematic view of the structure of a third supporting member in FIG. 6.
Figure 11:
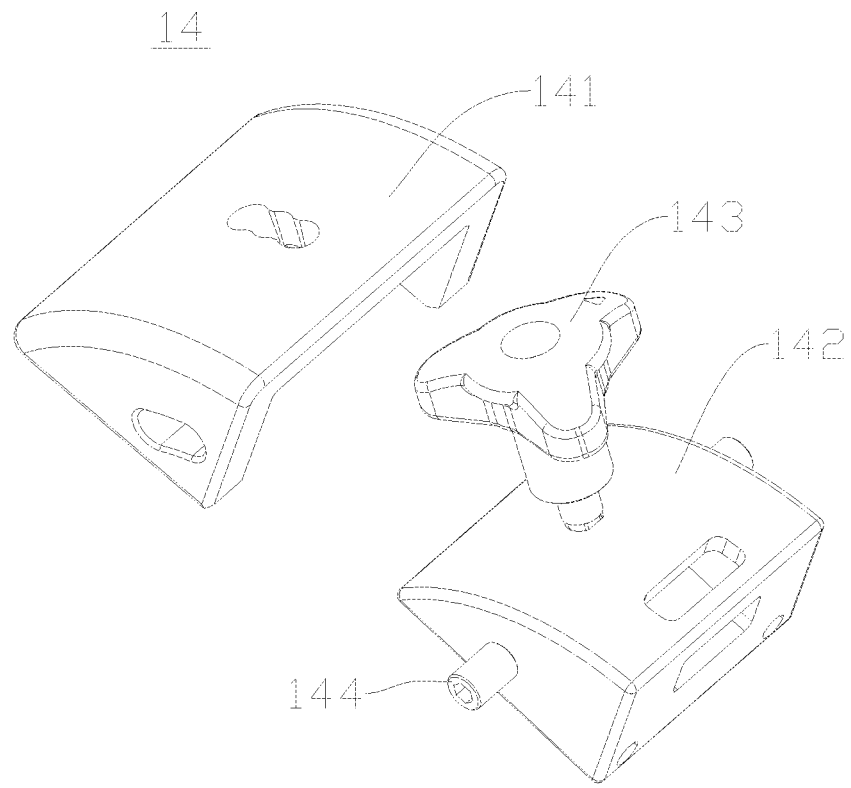
FIG. 11 is an exploded view of an angle adjuster in FIG. 3.
Figure 12:
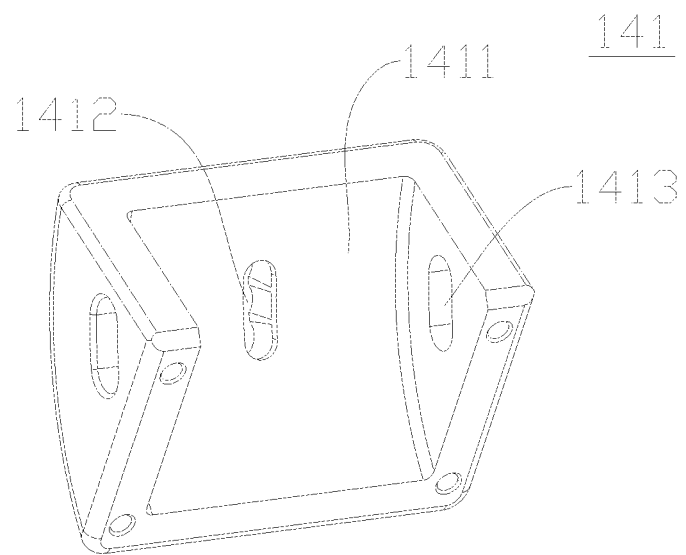
FIG. 12 is a schematic view of the structure of a mounting base in FIG. 3.
Figure 13:
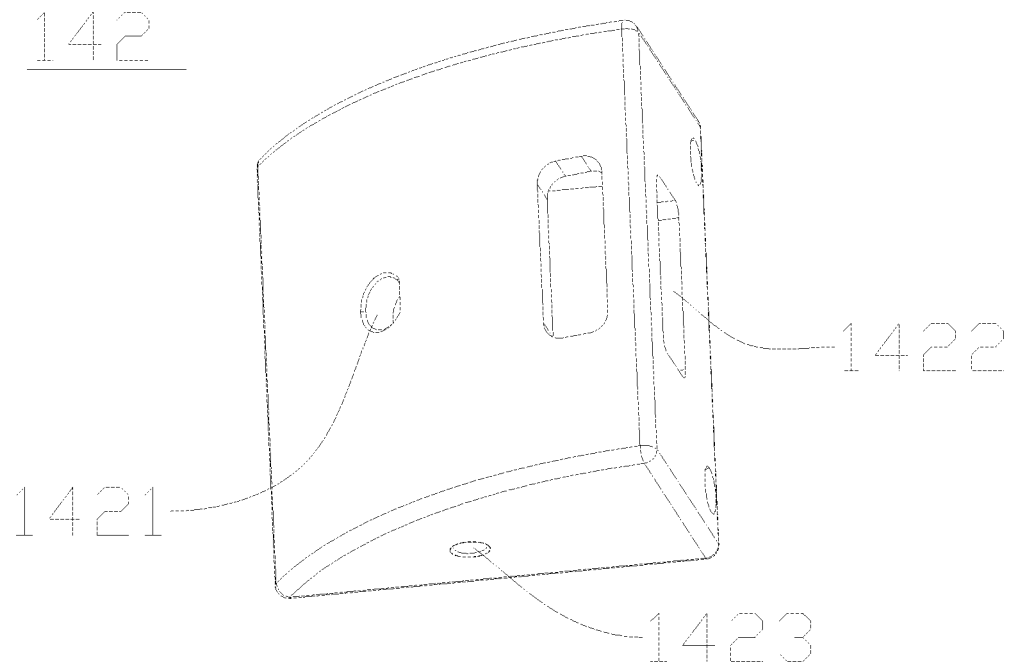
FIG. 13 is a schematic view of the structure of an adjusting block in FIG. 3.
Figure 14:
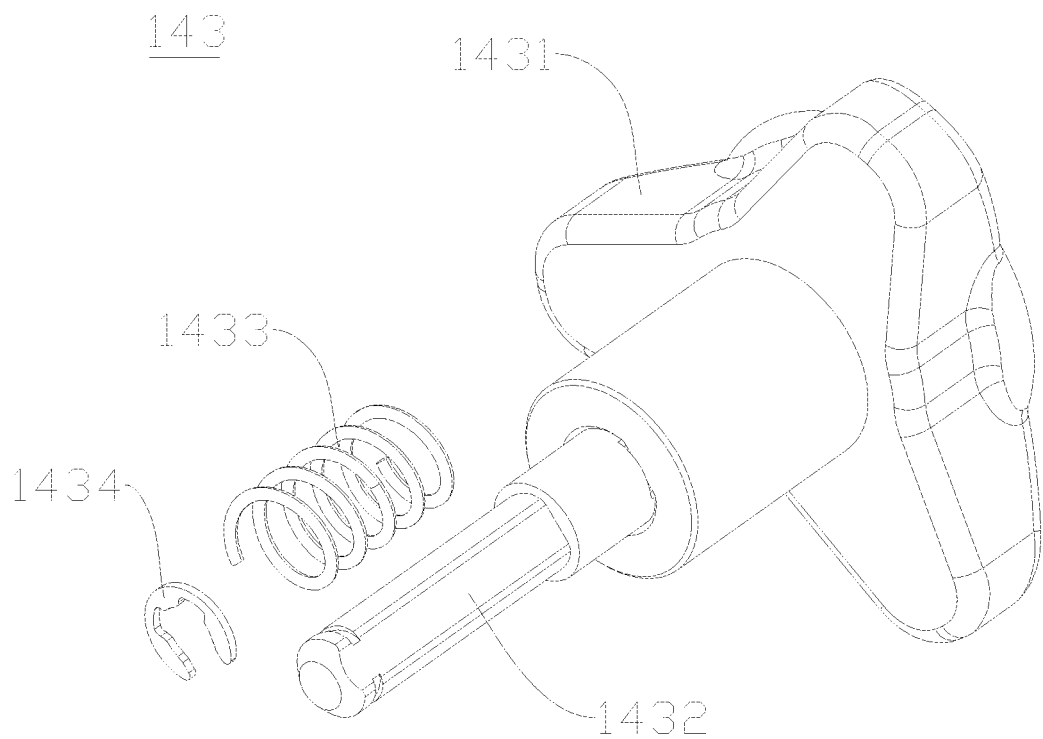
FIG. 14 is an exploded view of an adjusting handle in FIG. 3.
Figure 15:
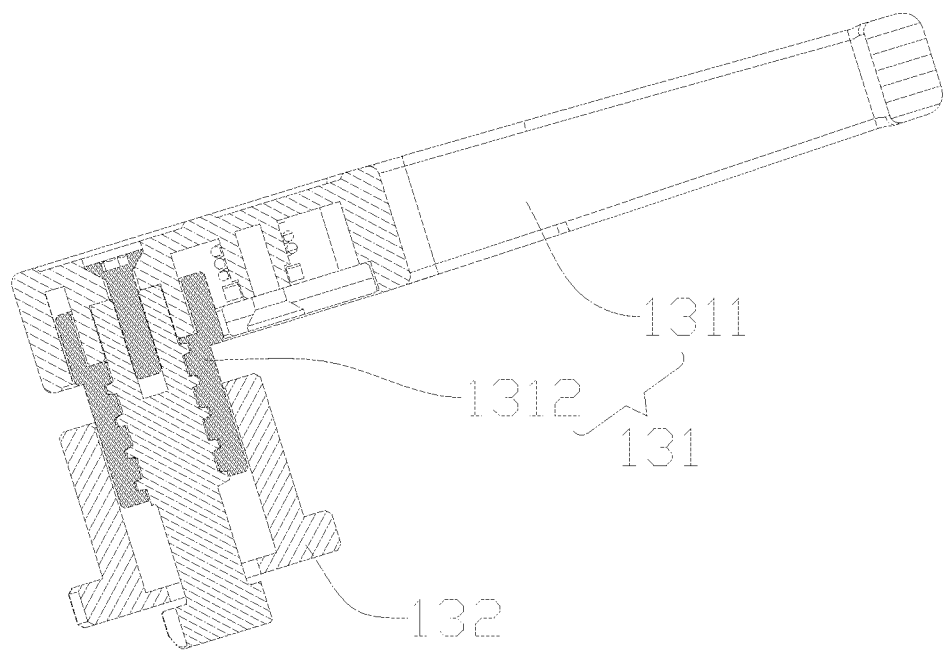
FIG. 15 is a cross-sectional view of a lock fastening component in FIG. 3.
Figure 16:
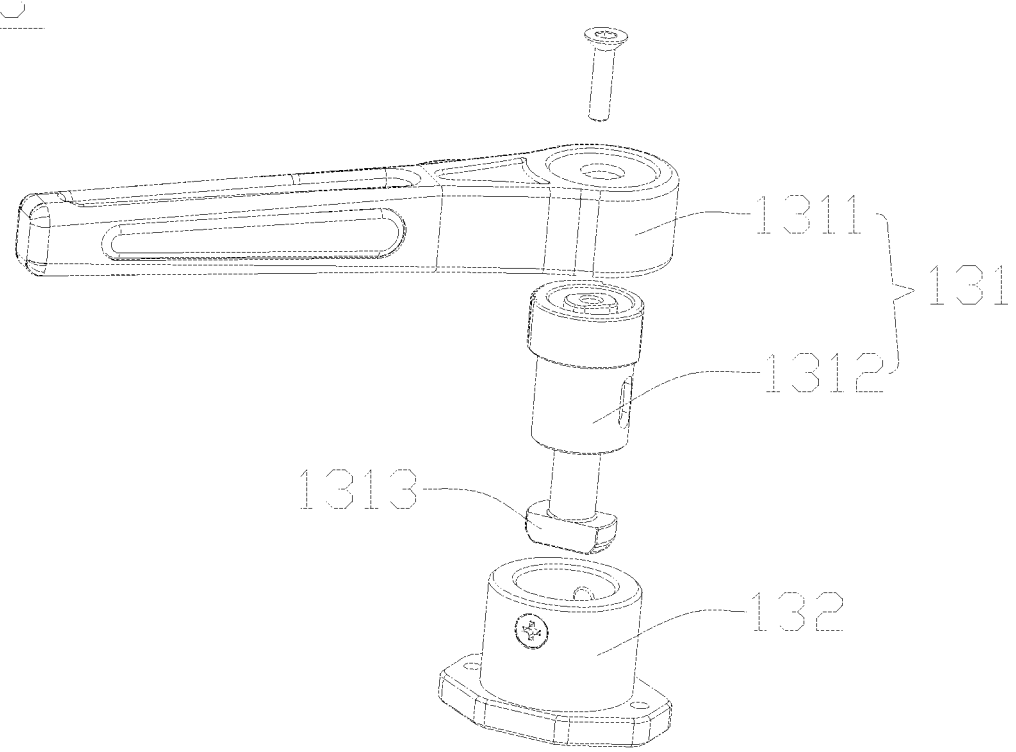
FIG. 16 is an exploded view of the lock fastening component in FIG. 3.
Figure 17:
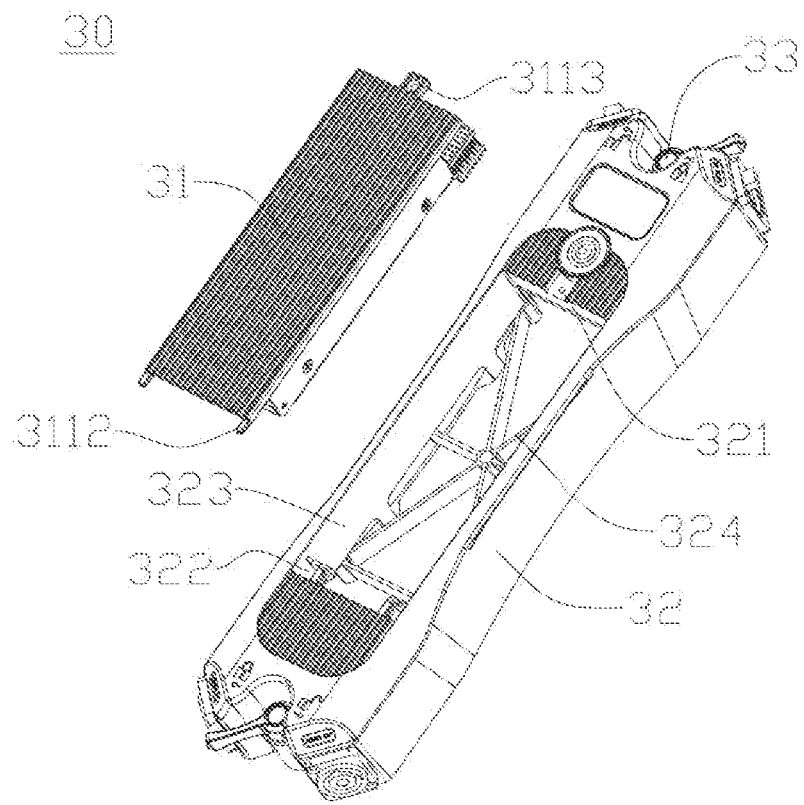
FIG. 17 is an exploded view of a control box in FIG. 2.
Figure 18:
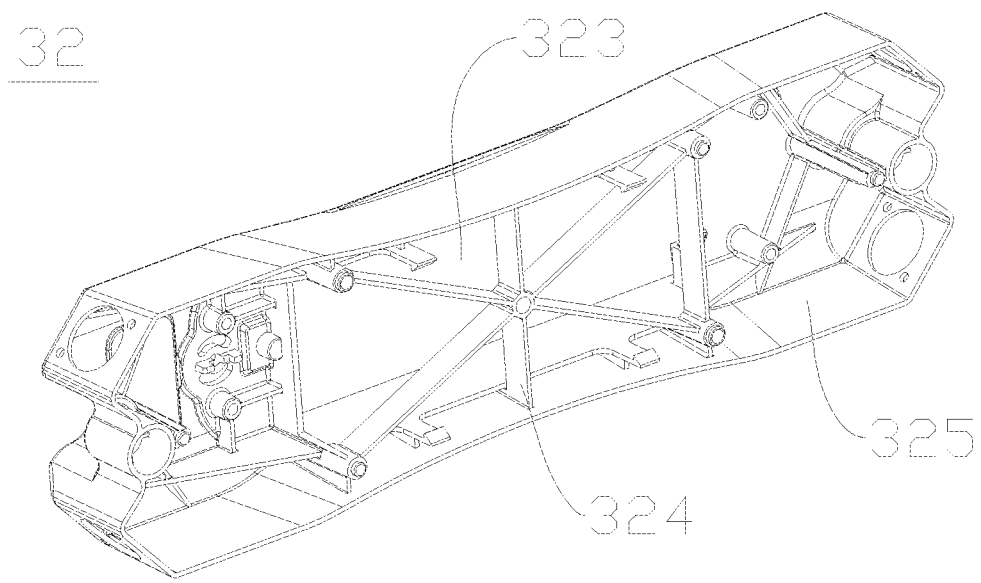
FIG. 18 is a schematic view of the structure of a cover body in FIG. 17.
Figure 19:
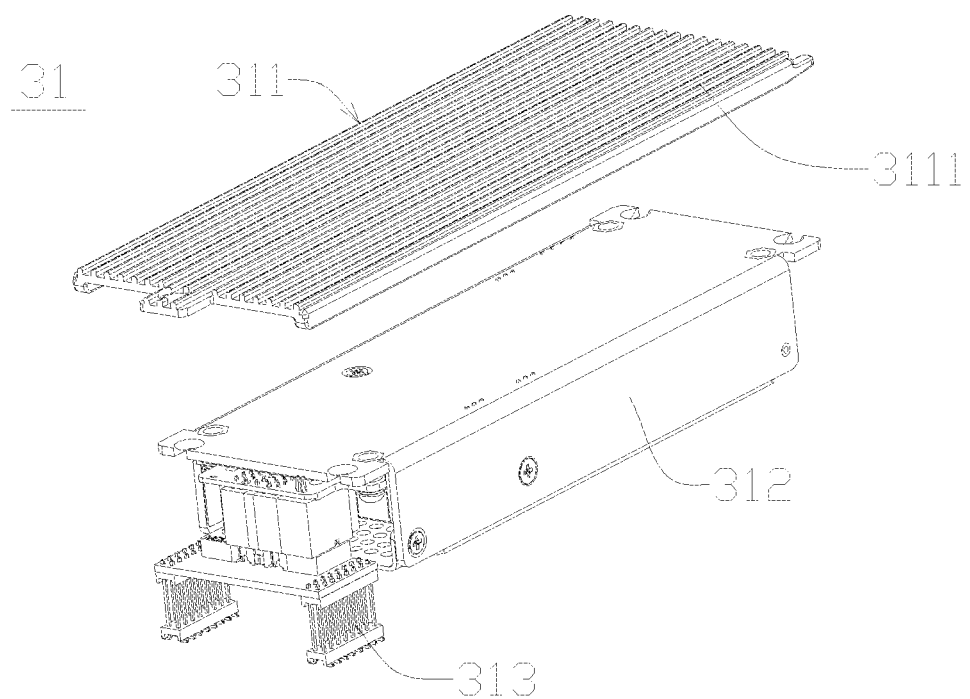
FIG. 19 is an exploded view of a power supply component in FIG. 17.
Figure 20:
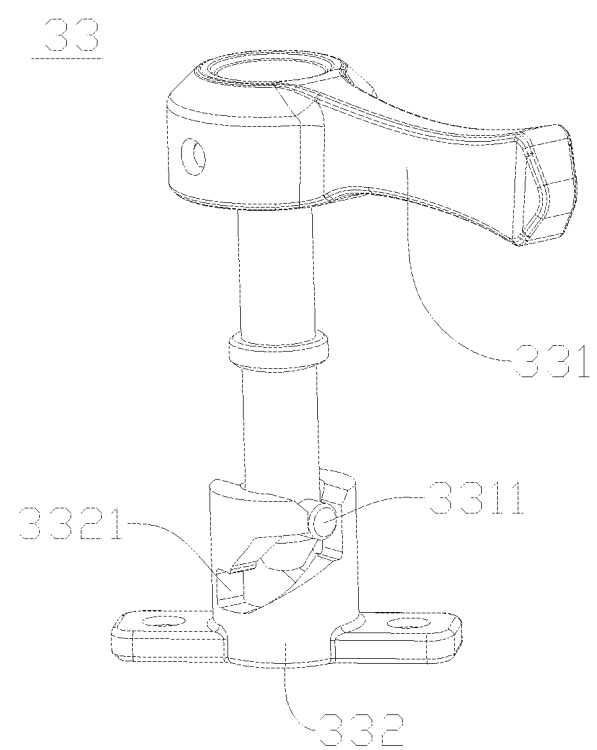
FIG. 20 is a schematic view of the structure of a lock fixing component in FIG. 17.
Figure 21:
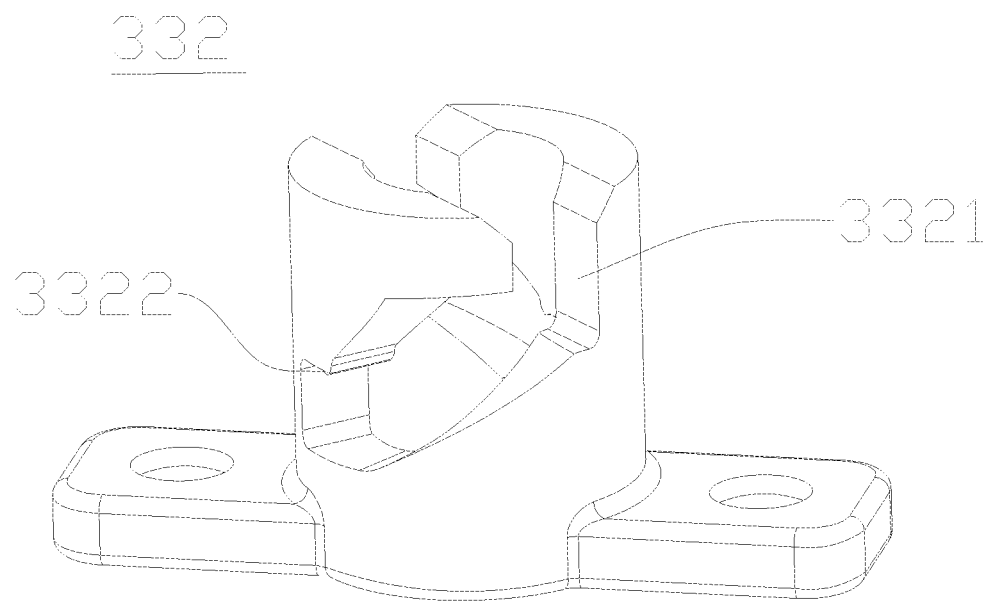
FIG. 21 is a schematic view of the structure of a female socket in FIG. 20.
Figure 22:
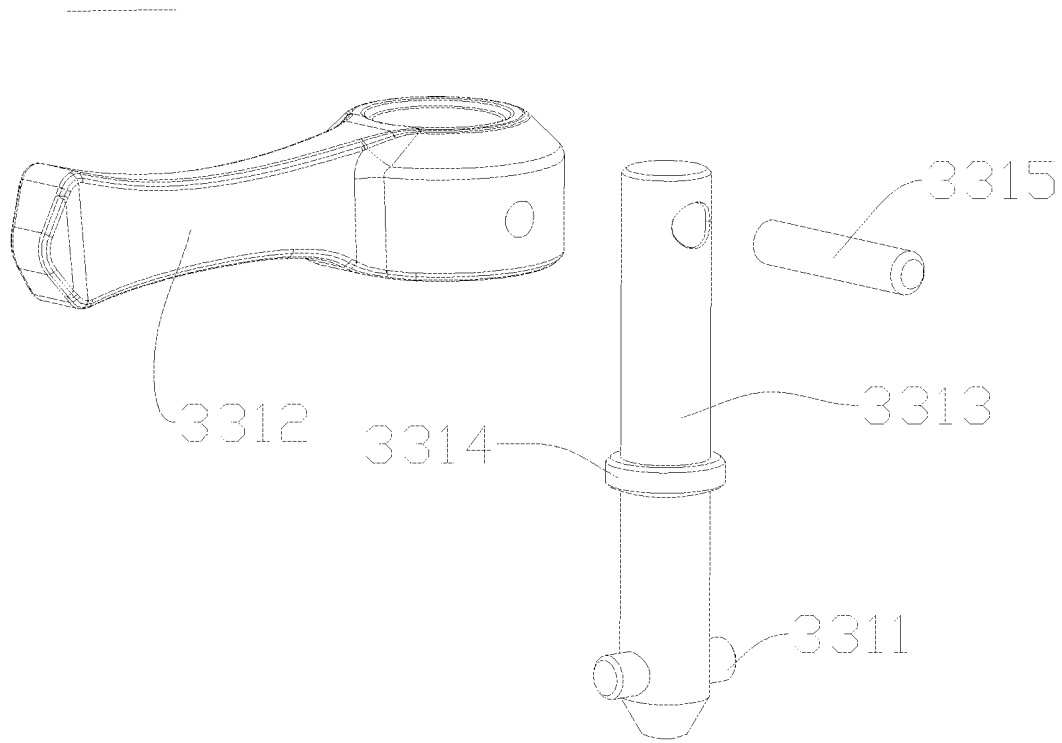
FIG. 22 is an exploded view of a male plug in FIG. 20.

As shown in FIGS. 1-22, an LED display panel provided by the present invention includes the main frame 10, the supporting component 20 and the control box 30. A power supply, a control system and a signal transmission system are arranged in the control box 30, and the control system and the signal transmission system are electrically connected to the power supply. The main frame 10 is made of a lightweight material, such as aluminum alloy, magnesium alloy, plastic and the like. The main frame 10 includes a first end surface (not shown in the figures) for mounting a display screen and a second end surface (not shown in the figures) opposing the first end surface. The supporting component 20 includes the supporting tube 21 and a plurality of supporting members 22. In the present embodiment, the control box 30 is mounted on the second end surface. Fixing parts (not shown in the figures) are arranged on peripheral edges of the second end surface, and the plurality of supporting members 22 are correspondingly mounted on the fixing parts. A tube fixing part is arranged at the end of the supporting member 22 far way from the second end surface, and the supporting tube 21 is fixed on the tube fixing part.

After the above technical solution is adopted, the main frame 10 is made of the lightweight material, and the supporting component 20 is arranged on the second end surface of the main frame 10, as such, the weight of the main frame 10 is reduced while the strength of the main frame 10 is ensured.

In an alternative embodiment, the main frame 10 includes the frame rods 11 that are arranged on the periphery of the main frame 10 and the supporting rods 12 that are arranged inside the main frame 10. The frame rods 11 and the supporting rods 12 are integratedly molded using a magnesium alloy material. The main frame 10 is ensured to have a relatively light weight and a relatively high strength; the frame rods 11 and the supporting rods 12 are combined fixedly without assembling, thereby simplifying the production process.

The technical problem that the current LED display screen is not conducive to the future development of light weight because its overall weight is relatively heavy can be solved through the main frame 10 having an integratedly molded structure.

In an alternative embodiment, the frame rods 11 and/or the supporting rods 12 are provided with a plurality of notches for reducing the mass of the LED display screen in its entity, and for ensuring the strength of the main frame 10.

In the present embodiment, every two frame rods 11 are connected to form a frame corner 115. The notches include the first notch arranged on the frame corner 115, the second notch 123 arranged on the supporting rod 12 and the third notch arranged on other position of the frame rod 11, which reduces the weight of the main frame 10, The present invention does not make any limitation on the notches.

In an alternative embodiment, edges of the notches of the frame rods 11 and/or supporting rods 12 are connected to a plurality of reinforcing ribs to ensure the frame rods 11 with a carrying capacity.

In the present embodiment, the reinforcing ribs include the first reinforcing rib 116 that is arranged on the frame rod 11 and the second reinforcing rib 124 that is arranged on the supporting rod 12. The first reinforcing rib 116 and the second reinforcing rib 124 reinforce the rigidity of the main frame 10 to ensure the carrying capacity of the frame rod 11, and the present invention does not make any limitation on positions of the first reinforcing rib 116 and the second reinforcing rib 124.

After the above technical solution is adopted, the weight of the main frame 10 is reduced by arranging the notches and reinforcing ribs on the frame rods 11 and/or the supporting rods 12, meanwhile, the carrying capacity of the main frame 10 is changed by using the reinforcing ribs to ensure an overall firmness of the main frame 10. Thus, the strength of the main frame 10 is ensured while the mass of the main frame 10 is reduced.

In an alternative embodiment, there are two supporting rods 12, which are arranged in a cross shape inside the main frame 10.

Specifically, the supporting rods 12 include the first supporting rod 121 and the second supporting rod 122. In the present embodiment, the frame rods 11 include the first frame rod 111, the second frame rod 112, the third frame rod 113, and the fourth frame rod 114. The first frame rod 111, the second frame rod 112, the third frame rod 113, and the fourth frame rod 114 are connected to each other to form a rectangular structure. The first supporting rod 121 and the second supporting rod 122 are orthogonally arranged inside the rectangular structure. The first supporting rod 121 is connected between the first frame rod 111 and the second frame rod 112. The second supporting rod 122 is connected between the third frame rod 113 and the fourth frame rod 114. In this way, the mass of the main frame 10 is further reduced while the carrying capacity of the main frame 10 is ensured. The width of the first supporting rod 121 is greater than the width of the second supporting rod 122, so that the control box 30 can be mounted on the first supporting rod 121.

In an alternative embodiment, the supporting member 22 includes a supporting member that is injection-molded by using polypropylene (PP) plastic and has a hollow structure, and/or the supporting tube 21 includes a carbon fiber tube made of carbon fiber material to further reduce the mass of the main frame 10 while maintaining the stability of the main frame 10.

In the present embodiment, the supporting member 22 includes the first supporting member 221, the second supporting member 222, and the third supporting member 223. The first supporting member 221 is clamped on the corner of the frame rods 11. The second supporting member 222 and the third supporting member 223 are mounted on the middle portion of the frame rod 11.

Specifically, the first supporting member 221 is provided with the buckle 2211. The second supporting member 222 is provided with the second supporting member fixing part 2222, and the third supporting member 223 is provided with the third supporting member fixing part 2232. The first supporting member 221 is clamped on the frame corner 115 through the buckle 2211. The second supporting member 222 is fixed on the middle portion of the third frame rod 113 and the middle portion of the fourth frame rod 114 through the second supporting member fixing part 2222. The third supporting member 223 is fixed on the first frame rod 111 and the second frame rod 112 through the third supporting member fixing part 2232.

In an alternative embodiment, the second supporting member 222 and the third supporting member 223 are shaped substantially similar, e.g., they are both triangular shape. The area of the second supporting member 222 is greater than the area of the third supporting member 223. In the present embodiment, the second supporting member 222 is provided with the second supporting member notch 2221, and the third supporting member 223 is provided with the third supporting member notch 2231 to further reduce the masses of the second supporting member 222 and the third supporting member 223 while ensuring the strengths of the second supporting member 222 and the third supporting member 223.

In an alternative embodiment, the tube fixing part includes the first tube fixing part 2214 and the second tube fixing part 2215. The first tube fixing part 2214 and the second tube fixing part 2215 are perpendicularly arranged on two adjacent sides of the first supporting member 221.

Specifically, the first supporting member 221 is provided with the first supporting member through the hole 2213 and the first supporting member notch 2212. The frame corner 115 is provided with the convex column 1152. The shape and size of the convex column 1152 is adapted to the shape and size of the first supporting member through hole 2213, enabling the first supporting member 221 to be clamped on the frame corner 115 along the axial direction of the convex column 1152 through the first supporting member through hole 2213. In this way, the first supporting member 221 can be quickly mounted on the frame corner 115, while the stability of the connection between the first supporting member 221 and the frame corner 115 is ensured. In the present embodiment, the first supporting member notch 2212 is arranged around the outer side of the first supporting member through hole 2213 to reduce the mass of the first supporting member 221, which further reduce the mass of the main frame 10.

In an alternative embodiment, the tube fixing part further includes a tube fixing hole. Specifically, the tube fixing hole includes the first tube fixing hole 2223 arranged on the second supporting member 222 and the second tube fixing hole 2233 arranged on the third supporting member 223. In the present embodiment, the number of the supporting tubes 21 is four. The four supporting tubes penetrate through the first tube fixing hole 2223 or the second tube fixing hole 2233, and both ends of the supporting tube 21 are fixed on the first tube fixing part 2214 and the second tube fixing part 2215, respectively.

After the above technical solution is adopted, since the supporting tube 21 is mounted on the second end surface of the main frame 10, the supporting tube 21 can be used as a handle of the main frame 10, which facilitates the transportation and splicing of the main frame 10. Meanwhile, a thickness of the main frame 10 is increased to ensure the stability of the main frame 10 when it is placed in a stand-up state on the horizontal plane.

In an alternative embodiment, the angle adjuster 14 and the side locking component 13 are arranged on the main frame 10, which enable a plurality of main frames 10 to be spliced through cooperation of the angle adjuster 14 and the side locking component 13.

In an alternative embodiment, the magnet 15 is arranged on the main frame 10 to perform a pre-locating function during the splicing process of the main frames 10.

After the above technical solution is adopted, the weight of the main frame 10 is reduced to about 5.5 KG. Note that the weight of the main frame 10 of the same specification currently known in the market is about 9.5 KG. Compared with other main frames on the market, the main frame 10 of the present invention can reduce weight by about 4 KG, which is not only convenient for mounting, but also convenient for transportation without increasing the cost of the product.

In an alternative embodiment, the lock fixing component 33 is further provided. Both ends of the control box 30 along a width direction is provided with a male plug mounting part, respectively. The second end surface is provided with a female socket mounting part, the number and positions of the female socket mounting parts correspond to the number and positions of the male plug mounting part. The lock fixing component 33 includes the female socket 332 and the male plug 331. The male plug 331 is mounted on the male plug mounting part, and the female socket 332 is mounted on the female socket mounting part. The female socket 332 is provided with the spiral track groove 3321, and the male plug 331 is provided with the latch 3311 cooperating with the track groove 3321. When the control box 30 is mounted on the second end surface, the latch 3311 is made to move along and be clamped in the track groove 3321 by rotating the male plug 331.

Specifically, the control box 30 has a rectangular structure. The male plug mounting part is arranged on the middle portion of two narrow sides of the control box 30, and the position of the female socket mounting part corresponds to the position of the male plug mounting part. When there is a need to maintain or replace the control box 30, after disconnecting the signal connection line and the power supply line that are connected between the LED display screen and the control box 30, the male plugs 331 and the female sockets 332 on the main frame are disconnected by rotating the two male plugs 331 on the control box 30, so that the control box 30 can be detached from the main frame. Otherwise, the control box 30 is mounted on the main frame. The operation is easy and simple. Only one male plug 331 is arranged on the middle portion of both ends of the control box 30, which simplifying the mounting operation, meanwhile, the control box 30 is ensured to be fixed on the main frame through the lock fixing component 33, which is safe and reliable.

In an alternative embodiment, the track groove 3321 includes a starting segment, a connection segment and an ending segment. Specifically, the starting segment is arranged along the axial direction of the female socket, the ending segment is parallel to an end surface of the female socket 332, and the connection segment is connected between the starting segment and the ending segment, so that when the latch 3311 moves along the track groove 3321, the latch 3311 can transit through the connection segment to the ending segment and be clamped at the position of the ending segment. This design ensures the control box 30 to be stably fixed on the main frame 10, when the latch 3311 transits from the ending segment to the starting segment, the control box 30 is conveniently detached from the main frame 10.

In an alternative embodiment, an angle between an extending line of the connection segment and an extending line of the ending segment is ranged from 130° to 140°. Specifically, the angle between the extending line of the connection segment and the extending line of the ending segment is 135°, which ensures a track length of the track groove 3321 to enable the control box 30 to be stably fixed on the main frame 10, and the strength of the female socket 332 after the track groove 3321 is arranged.

In an alternative embodiment, the clamping platform 3322 is arranged on the connection portion of the connection segment and the ending segment to enable the latch 3311 to be clamped between an end of the ending segment far away from the clamping platform 3322 and the clamping platform 3322.

Specifically, the clamping platform 3322 is semicircular shaped, which enables the latch 3311 to be quickly moved from the clamping platform 3322 into the ending segment. The clamping platform 3322 is arranged at a side of the ending segment adjacent to the starting segment to enable the control box 30 to be stably fixed on the main frame 10. For example, after the control box 30 and the main frame 10 are connected together, the control box 30 always retains a moment of force that deviates from the main frame 10, that is, the latch 3311 is always located between the ending segment and the clamping platform 3322. If the control box 30 needs to be detached, the control box 30 is pressed toward the main frame 10 so that the latch 3311 can slightly deviate from the clamping platform 3322. The male plug 331 is rotated so that the latch 3311 passes over the clamping platform 3322 and moves toward the starting segment along the connection segment, and when the latch 3311 enters the starting segment, the control box 30 is detached out from the main frame 10. Thus, this is a simple operation.

In an alternative embodiment, the male plug 331 includes the lock rod 3313 and the handle 3312. The handle 3312 is connected to an end of the lock rod 3313, and the latch 3311 is arranged on the end of the lock rod 3313 far away from the handle 3312.

Specifically, the male plug 331 further includes the fixing pin 3315, and the handle 3312 is detachably connected to the lock rod 3313 through the fixing pin 3315.

After the above technical solution is adopted, different materials can be selected for molding according to the use of the lock rod 3313 and the handle 3312. For example, since the handle 3312 is always contact with both hands of the user, the handle 3312 can be made of plastic material to reduce a torque required when the user rotates the lock rod 3313 through the handle 3312, while the lock rod 3313 can be molded by selecting a metal material to increase a service life of the male plug 331.

In an alternative embodiment, the rotating platform 3314 is arranged on the middle portion of the lock rod 3313. The shortest distance from the rotating platform 3314 to an end surface of the handle 3312 adapts to a length of the lock rod 3313 that passes through the control box 30.

Specifically, the shortest distance from the rotating platform 3314 to the end surface of the handle 3312 is equal to or slightly greater than a depth of the male plug mounting part. When the male plug 331 is mounted on the male plug mounting part, an end of the lock rod 3313 for mounting the handle 3312 passes through the male plug mounting part until the rotating platform 3314 abuts against the end surface of the male plug mounting part. The handle 3312 is mounted on the lock rod 3313, and is fixed by the fixing pin 3315 so that the male plug mounting part is clamped between the handle 3312 and the rotating platform 3314. This structure is simple and practical.

In an alternative embodiment, the male plug mounting part is arranged on the middle portion of both ends of the control box 30. An unlocking identification and a locking identification are arranged on both sides of the male plug mounting part, respectively. Both the unlocking identification and the locking identification are located at the most eye-catching display positions on the front of the male plug mounting part to remind the user how to select a rotation direction of the handle 3312, thereby simplifying the detaching and mounting difficulty of the control box 30.

In an alternative embodiment, the female socket mounting part is concavely arranged on the main frame 10. In the present embodiment, the female socket 332 includes a female socket fixing part and a female socket lock fixing part. The female socket fixing part is fixed on both sides of the female socket mounting part, and the female socket lock fixing part is mounted on a concave portion of the female socket mounting part.

Specifically, the shape and size of the concave portion of the female socket mounting part is adapted to the shape and size of the female socket lock fixing part. The track groove 3321 is arranged on the female socket lock fixing part, so that the female socket 332 can be ensured to be stably fixed on the female socket mounting part to further ensure the stability of the connection between the control box 30 and the main frame 10.

In an alternative embodiment, the control box 30 includes the box body and the power supply component 31. The box body includes a cover body and a base. The cover body is provided with the cavity 325 having an opening. The control system and the signal transmission system are mounted in the cavity 325. The base covers onto the opening of the cavity to protect the control system and the signal transmission system. In the present embodiment, the power supply component 31 includes the power supply mounting member and the power supply 312. The power supply 312 is mounted on the power supply mounting member, and the control system and the signal transmission system are electrically connected to the power supply 312. The power supply component mounting groove 323 is arranged on an end surface of the cover body opposing the opening of the cavity 325, and the power supply component mounting groove 323 communicates with the cavity 325. The power supply 312 is detachably mounted on the power supply component mounting groove 323 through the power supply mounting member.

After the above technical solution is adopted, when the power supply fails, the maintainer can directly detach the power supply 312 from the control box to perform maintenance without detaching the entire control box from the LED display screen. Thus, the operation is simple, convenient, and fast, which helps to reduce the operation time.

In an alternative embodiment, the power supply mounting member includes the aluminum substrate 311. The shape and size of the aluminum substrate is adapted to the shape and size of the power supply component mounting groove 323. The power supply 312 is mounted on the aluminum substrate 311 through the thermal conductive silica gel so that the heat generated during a working process of the power supply 312 is transferred into the aluminum substrate 311 through the thermal conductive silica gel, and dissipated into air outside of the aluminum substrate 311 through the aluminum substrate 311, thereby enhancing the heat dissipation effect of the power supply 312 and effectively prolonging a service life of the power supply 312.

In an alternative embodiment, a heat dissipation member is arranged on an end surface of the aluminum substrate 311 opposing the power supply 312 to improve the heat dissipation effect of the power supply 312 and effectively prolong the service life of the power supply 312.

Specifically, the heat dissipation member includes at least two parallel diversion grooves 3111 arranged on the aluminum substrate 311 to increase a heat dissipation area of the aluminum substrate 311. Specifically, when the power supply 312 is in a working state, the heat generated by the power supply 312 is transferred into the diversion grooves 3111 on the aluminum substrate 311 via the aluminum substrate 311 and then dissipated into the air through the diversion grooves 3111. A part of heat is prevented from being dissipated into the aluminum substrate 311 during the transferring process, thereby enhancing the heat dissipation effect.

In an alternative embodiment, the power supply 312 includes a power supply body, a power supply shell and the AC/DC adapter board 313. The power supply body is mounted on the power supply shell, and the power supply shell is mounted on the power supply component mounting groove 323 through the aluminum substrate 311. In the present embodiment, the AC/DC adapter board 313 is electrically connected to the power supply body to perform voltage reduction and rectification to supply power to the control system, the signal transmission system and other electronic elements on the LED display screen.

Specifically, an end surface of the aluminum substrate 311 facing to the power supply 312 is provided with an aluminum substrate mounting groove, and the power supply shell is fixed on the aluminum substrate mounting groove. In the present embodiment, the power supply shell includes a shell cover and a shell base. The cross section of the shell cover is shaped as the letter "C". The shell cover can be made by cutting and bending a plate material. The embodiment increases the production efficiency while maintaining a low cost.

The assembling process of the power supply shell, only requires mounting the power supply body within the shell cover, and covering the shell base into the shell cover. Thus, the assembling efficiency is greatly improved.

In an alternative embodiment, a base slot and a base screw hole are arranged on both ends of the shell base, respectively. A cover clamping platform and a cover through hole are arranged on both ends of the shell cover, respectively. One end of the shell base and one end of the shell cover are clamped together through the cover clamping platform and the base slot. The other end of the shell base and the other end of the shell cover are connected together by a fixing screw passing through the base screw hole and the cover through hole.

In an alternative embodiment, the cover body 32 is provided with a plurality of supporting plates 324 at the position of the power supply component mounting groove 323. The plurality of supporting plates 324 are arranged to cross each other under the power supply component mounting groove 323.

Specifically, considering the case where the power supply 312 generates heat in use, the cover body 32 is designed into a hollow structure with a large area, only the supporting plates for carrying the power supply are retained at the diagonal lines and the middle of the power supply component mounting groove 323, so as to maximize the heat dissipation area of the control box to further enhance heat dissipation intensity of the control box.

In an alternative embodiment, the lock fixing part 3113 is arranged on the power supply mounting member, the mounting part 321 is arranged on one side of the power supply component mounting groove 323, and the position of the lock fixing part 3113 corresponds to the position of the mounting part 321.

Specifically, the lock fixing part 3113 is the through hole arranged on the aluminum substrate 311, and the mounting part 321 is the screw hole arranged on the cover body 32, so that the screw can pass through the lock fixing part 3113 and then be screw-threaded with the mounting part 321, which not only facilitates the detaching of the aluminum substrate 311, but also ensures the stability of the fixing of the aluminum substrate 311.

In an alternative embodiment, one of the power supply mounting member and the cover body 32 is provided with the clamping notch 322, and the other one of the power supply mounting member and the cover body 32 is provided with the clamping platform 3112, and the clamping platform 3112 is engaged with the clamping notch 322.

In the present embodiment, there are two clamping platforms 3112, which are symmetrically arranged on both sides of an end of the aluminum substrate 311 opposite the lock fixing part 3113. The clamping platform 3112 is shaped as a triangular structure, and one side of the clamping platform 3112 adjacent to the cover body 32 is a bevel edge, so that the clamping platform 3112 can be quickly inserted into the clamping notch 322 on the cover body 32.

In an alternative embodiment, the clamping notch 322 is formed by crossing convex ribs extended from the cover body 32, which ensures the largest area of the hollow structure on the cover body 32, and enables the clamping platform 3112 to be clamped in the clamping notch 322 to perform functions of pre-locating, limiting and connecting.

In an alternative embodiment, the box body is made of an aluminum alloy material, and the above-described diversion grooves 3111 are arranged on one end surface of the box body on which the aluminum substrate 311 is mounted, which ensures coordination of the whole structure of the control box, and enhances the heat dissipation effect of the control box at the same time.

After the above technical solution is adopted, when the power supply fails, a user can directly detach the power supply 31 from the control box to perform maintenance without detaching the entire control box from the LED display screen. The operation is simple, convenient, and fast. Meanwhile, the heat dissipation effect of the control box is also improved, which effectively prolongs the service life of the power supply 31.

In an alternative embodiment, the angle adjuster 14 and the lock fastening component 13 are arranged on the main frame 10. Specifically, the angle adjuster 14 and the lock fastening component 13 are mounted on two opposing sides of the main frame 10, respectively, so that multi-angle splicing of two LED display panels are implemented through the angle adjuster 14 and the lock fastening component 13. This design simplifies the splicing process as it eliminates the need for any tool.

Specifically, the angle adjuster 14 includes the mounting base 141 and the adjusting block 142. The lock fastening component 13 includes the fixing base 132 and the handle component 131 configured to cooperate with the adjusting block. In the present embodiment, the adjusting block 142 is rotatably mounted on the mounting base 141. The mounting base 141 is mounted on one side of the main frame 10. The fixing base 132 is mounted on the other side of the main frame 10 opposing the mounting base 141. The handle component 131 is rotatably mounted on the fixing base 132. A position of the fixing base 132 corresponds to a position of the mounting base 141.

In an alternative embodiment, the number of the angle adjusters 141 matches the number of the lock fastening components 13. The angle adjusters 14 and the lock fastening components 13 are arranged on the two opposing sides of the main frame 10, respectively. When two main frames 10 are spliced together, the lock fastening components 13 on one of the two main frames 10 are connected to the angle adjusters 14, and on the other one of the two main frames 10 to implement the splicing. In the present embodiment, because the adjusting block 142 is rotatably mounted on the mounting base 141, a rotation angle of the adjusting block 142 relative to the mounting base 141 can also be adjusted for implementing an angle of the two main frames 10 after the splicing, such as a human-centered arc-shaped screen, a U-shaped screen or the like. Because the angle formed by the two main frames 10 can be adjusted by the angle adjuster 14, the splicing is convenient, fast, and practical.

In an alternative embodiment, the adjusting block 142 includes a first side surface, a second side surface, a curved surface structure, and an end surface structure. Each of the first side surface and the second side surface is a quarter arc surface. The first side surface is located at one side of the adjusting block 142, and the second side surface is located at the other side of the adjusting block 142. The curved surface structure is connected between the arc edge of the first side surface and the arc edge of the second side surface. The end surface structure is connected between a right-angle side of the first side surface and a right-angle side of the second side surface. In the present embodiment, the end surface structure is provided with the connection part 1422 cooperating with the handle component 131. Such structure is simple but practical.

Specifically, the latching part 1313 is arranged on the handle component 131. When the handle component 131 and the angle adjuster 14 are mounted on the two opposing sides of the main frame 10, respectively. The directions of the latching part 1313 and the connection part 1422 are facing towards the outside of the main frame 10, so that when two main frames 10 are spliced together, the latching part 1313 can be buckled onto the connection part 1422. A relative angle formed by the two main frames 10 can be adjusted by rotating the adjusting block 142.

In an alternative embodiment, the angle adjuster 14 further includes the adjusting handle 143. The mounting base 141 is provided with the movable cavity 1411 adapted to a shape of the adjusting block 142. The adjusting block 142 is mounted in the movable cavity 1411. The adjusting handle 143 passes through the mounting base 141, and is then connected to the adjusting block 142 to adjust the rotation angle of the adjusting block 142 relative to the mounting base 141 for the rotation angle of the adjusting block 142 relative to the mounting base 141 to be controlled by the adjusting handle 143. For example, the rotation angle of the adjusting block 142 relative to the mounting base 141 can be enlarged or narrowed, so as to change a radian formed by the two main frames 10.

After the above technical solution is adopted, the angle adjuster 14 can be used to splice the conventional flat display screen as well as the arc-shaped display screen, the two splicing manners are compatible. This design makes the splicing convenient and fast with good effect. Meanwhile, the angle adjuster 14 can perform controlling through the adjusting handle 143, for convenient, practical and reliable angle adjustment.

In an alternative embodiment, the adjusting handle 143 includes the first lock rod 1432 and the first lock handle 1431. In the present embodiment, the curved surface structure is provided with the perforation 1421, and the mounting base is provided with the adjusting hole 1412. One end of the first lock rod 1432 passes through the adjusting hole 1412 and then extends out of the adjusting hole 1412, while the other end of the first lock rod 1432 passes through the perforation and is then fixed through the clamping ring 1434. The first lock handle 1431 is mounted on the end of the first lock rod 1432 passing through the adjusting hole 1412 to adjust a position of the adjusting block 142 in the movable cavity 1411.

Specifically, the adjusting handle 143 further includes the elastic member 1433. After the first lock rod 1432 passes through the perforation 1421, the elastic member 1433 is mounted on the first lock rod 1432. One end of the elastic member 1433 abuts against the clamping ring 1434, and the other end of the elastic member 1433 abuts against a side of the curved surface structure facing towards the clamping ring 1434. In the present embodiment, the adjusting hole 1412 is formed by sequentially connecting two through holes with different diameters. The through holes include a first through hole and a second through hole, respectively, and a diameter of the second through hole is smaller than a diameter of the first through hole. The first lock rod 1432 includes a big end and a small end with diameters matching the two through holes. For example, a diameter of the big end is adapted to the diameter of the first through hole, and a diameter of the small end is adapted to the diameter of the second through hole, so that the big end can be clamped on the adjusting hole 1412 under an action of the elastic member 1433, and the small end is movable in the adjusting hole 1412 under the action of the elastic member 1433.

When it needs to adjust the angle of the adjusting block 142 relative to the mounting base 141, the first lock rod 1432 is driven to move upward by tightening the first lock handle 1431, so that the second end that is smaller can move from one first through hole to the other adjacent first through hole through the second through hole, and the elastic member 1433 is in a compressed state at this time. After the first lock handle 1431 is released, the elastic member 1433 resets and drives first end that is larger to be clamped on the other first through hole, thereby completing the angle adjustment of the adjusting block 142. This structure is simple and practical.

In the present embodiment, there are three first through holes, that is, the angle adjuster 14 totally has three gear positions: −5°, 0° and 5°. In use, the adjusting block 142 can be switched to positions corresponding to different angles by tightening the first lock handle 1431 on the angle adjuster 14 and moving the first lock handle 1431.

Specifically, the gear positions of the angle adjuster 14 can be customized according to the user's demands, and the present invention does not make any limitation.

In an alternative embodiment, the angle adjuster 14 further includes the positioning pin 144. The pin hole 1413 is arranged on both sides of the mounting base 141, respectively. The positioning pin 144 passes through the pin hole 1413 and is mounted on the adjusting block 142, so that the adjusting block 142 can rotate along the pin hole 1413 through the positioning pin 144.

Specifically, the adjusting block 142 is provided with the pin fixing hole 1423. The positioning pin 144 passes through the pin hole 1413 and then is screw-threaded with the pin fixing hole 1423.

In an alternative embodiment, the handle component 131 includes the second lock rod 1312 and the second lock handle 1311. The second lock rod 1312 includes a lock rod body and a rotating shaft. In the present embodiment, the lock rod body penetrates through the rotating shaft, and the rotating shaft is mounted on a side of the main frame 10 through the fixing base 132. The second lock handle 1311 is fixedly connected to the lock rod body to drive the lock rod body to move back and forth along an axial direction of the rotating shaft.

Specifically, the lock rod body includes a screw shaft along the axial direction, and the rotating shaft is provided with a screw hole matching the screw shaft. The screw shaft is rotatably mounted in the screw hole through the second lock handle 1311.

When the second lock handle 1311 drives the lock rod body to rotate, because the lock rod body and the rotating shaft are connected through the cooperation of the screw shaft and the screw hole, the lock rod body can extend out of or shrink into the rotating shaft, so that the latching part 1313 on the lock rod body can be connected to the connection part 1422 on the other main frame 10 to further implement the splicing of the two main frames 10.

In an alternative embodiment, the rotating shaft is provided with a ratchet wheel, the second lock handle is provided with a ratchet pawl, and the ratchet pawl cooperates with the ratchet wheel to limit a rotation direction of the second lock handle 1311.

Specifically, the second lock handle 1311 includes a handle body, a control member, and a reset member. The ratchet pawl is arranged on the control member. One end of the reset member abuts against the handle body, and the other end of the reset member abuts against the control member. When the ratchet pawl limits the second lock handle to rotate only in an anticlockwise direction, the second lock handle can drive the lock rod body to move back and forth only in the anticlockwise direction, so that the latching part 1313 is connected to the connection part 1422 to ensure the reliability of the latching part 1313 and the connection part 1422. When the limitation on the rotation direction of the second lock handle 1311 needs to be released, the ratchet pawl is disengaged from the ratchet wheel by pressing the control member, so that the latching part and the connection part can be disconnected. This structure is simple but practical.

After the above technical solution is adopted, when the two main frames 10 are spliced, the splicing process does not require any tool, which makes the splicing and detaching process efficient and occupies less labor. Meanwhile, it can also be ensured that the two main frames 10 are connected firmly in an arc shape, which are not easy to be loosen or fallen off.

In the description of the present invention, it should be noted that the terms "mount", "connect to each other" and "connect" should be understood broadly unless there are other explicit specifications and limitations. For example, the term "connect" can be understood as, fixed connection, detachable connection, integrate connection, mechanical connection, electrical connection, direct connection, indirect connection through an intermediate media, internal communication of the two elements, or interaction between the two elements. For those having ordinarily skill in the art, the specific meanings of the above terms in the present invention can be understood according to the specific situations.

In the present invention, unless there are other explicit specifications and limitations, the first feature "on" or "under" the second feature can include direct contact of the first and second features, and can also include contact of the first and second through another feature therebetween instead of the direct contact. Moreover, the first feature "above" and "on" the second feature includes the first feature directly above and diagonally above the second feature, or simply means that the first feature has a higher level than the second feature. The first feature "under" the second feature includes the first feature directly under and diagonally under the second feature, or simply means that the first feature has a lower level than the second feature.

The present invention mentioned above provides multiple different embodiments or examples to implement different structures of the present invention. The components and settings of the specific examples are described in the above text in order to simplify the description of the present invention. Certainly, they are merely illustrative examples and are not intended to limit the present invention. In addition, the present invention can repeat reference numerals and/or reference letters in different examples, and such repetitions are for purposes of simplification and clearness. The reference numerals and/or reference letters themselves do not refer to the relationships between various discussed embodiments and/or settings. Moreover, the present invention provides various examples of the specific processes and materials, but those having ordinarily skill in the art can be aware of the application of other processes and/or usage of other materials.

In the description of the present invention, the description by referring to the terms "an embodiment", "some embodiments", "exemplary embodiment", "example", "specific example", "some examples" and the like means that the specific features, structures, materials or characteristics described in conjunction with the embodiments or the examples are included in the at least one embodiment or example of the present invention. In the description, the illustrative expressions of the above terms do not necessarily refer to the same embodiment or example. Moreover, the described specific features, structures, materials or characteristics can be combined in a proper manner in any one of or more embodiments or examples.

Although the embodiments of the present invention have been shown and described, those having ordinarily skill in the art can understand: various changes, modifications, replacements and transformations can be made to these embodiments without departing from the principle and purpose of the present invention, and the scope of the present invention is defined by the claims and other equivalents.

INDUSTRIAL APPLICABILITY

An LED display panel includes a supporting component, a main frame made of a lightweight material, and a control box. A power supply, a control system and a signal transmission system are arranged in the control box. The main frame includes a first end surface for mounting a display screen and a second end surface opposing the first end surface. The control box is mounted on the second end surface. The supporting component includes a supporting tube and a plurality of supporting members. Fixing parts are arranged on peripheral edges of the second end surface, and the plurality of supporting members are correspondingly mounted on the fixing parts. A tube fixing part is arranged at an end of the supporting member far away from the second end surface, and the supporting tube is fixed on the tube fixing part. The mass of the frame structure is reduced, and the strength of the frame structure is ensured.

An LED display panel includes:

a main frame made of a lightweight material; the main frame includes a first end surface for mounting a display screen and a second end surface opposing the first end surface;

a supporting component; the supporting component includes a supporting tube and a plurality of supporting members; fixing parts are arranged at peripheral edges of the second end surface, and the plurality of supporting members are correspondingly mounted on the fixing parts; a tube fixing part is arranged at an end of the supporting member far away from the second end surface, and the supporting tube is fixed on the tube fixing part; and a control box; a power supply, a control system and a signal transmission system are arranged in the control box, and the control system and the signal transmission system are electrically connected to the power supply; the control box is mounted on the second end surface.

What is claimed is:

1. An LED display panel, comprising:
   a main frame made of a lightweight material, wherein the main frame comprises a first end surface for mounting a display screen and a second end surface opposing the first end surface;
   a supporting component, wherein the supporting component comprises a supporting tube and a plurality of supporting members; a plurality of fixing parts are arranged on peripheral edges of the second end surface, and the plurality of supporting members are mounted on the plurality of fixing parts corresponding to the plurality of supporting members; a tube fixing part is arranged on an end of the supporting member, wherein the end of the supporting member is far away from the second end surface, and the supporting tube is fixed on the tube fixing part; and
   a control box, wherein a power supply, a control system and a signal transmission system are arranged in the control box, and the control system and the signal transmission system are electrically connected to the power supply; and the control box is mounted on the second end surface;

wherein the main frame comprises frame rods arranged on a periphery of the main frame and supporting rods arranged inside the main frame; the frame rods and the supporting rods are integratedly molded by using a magnesium alloy material; and two supporting rods are arranged in a cross shape inside the main frame; and/or, the supporting member is injection-molded by using polypropylene (PP) plastic and has a hollow structure; and/or the supporting tube comprises a carbon fiber tube made of a carbon fiber material; and/or, the supporting member comprises a first supporting member and a second supporting member; the first supporting member is clamped on a corner of the frame rods, and the second supporting member is mounted on a middle portion of each of the frame rods.

2. The LED display panel of claim 1, wherein the frame rods and/or the supporting rods are provided with a plurality of notches for reducing a mass; and/or, edges of the plurality of notches of the frame rods and/or the supporting rods are connected to a plurality of reinforcing ribs.

3. The LED display panel of claim 1, wherein the tube fixing part comprises a first tube fixing part and a second tube fixing part, and the first tube fixing part and the second tube fixing part are perpendicularly arranged on two adjacent sides of the first supporting member; and/or, the tube fixing part further comprises a tube fixing hole, and the tube fixing hole is arranged on the second supporting member; four supporting tubes penetrate through the tube fixing hole; both ends of each of the four supporting tubes are fixed on the first tube fixing part and the second tube fixing part, respectively.

4. The LED display panel of claim 1, wherein the control box comprises:

a box body, wherein the box body comprises a cover body and a base; the cover body is provided with a cavity having an opening; the control system and the signal transmission system are mounted in the cavity, and the base covers onto the opening of the cavity; and a power supply component, wherein the power supply component comprises a power supply mounting member and a power supply; the power supply is mounted on the power supply mounting member, and the control system and the signal transmission system are electrically connected to the power supply;

wherein, a power supply component mounting groove is arranged at an end surface of the cover body, wherein the end surface of the cover body is opposing the opening of the cavity, and the power supply component mounting groove communicates with the cavity; the power supply is detachably mounted on the power supply component mounting groove through the power supply mounting member.

5. The LED display panel of claim 4, wherein the power supply mounting member comprises an aluminum substrate; a shape and a size of the aluminum substrate are adapted to a shape and a size of the power supply component mounting groove, and the power supply is mounted on the aluminum substrate through a thermal conductive silica gel; and/or, a heat dissipation member is arranged at an end surface of the aluminum substrate, wherein the end surface of the aluminum substrate is opposing the power supply; and/or, the heat dissipation member comprises at least two parallel diversion grooves arranged on the aluminum substrate.

6. The LED display panel of claim 4, wherein a plurality of supporting plates are provided at a position of the cover body, wherein the position corresponds to the power supply component mounting groove, wherein the plurality of supporting plates are arranged to cross each other at a lower part of the power supply component mounting groove; and/or, a lock fixing part is arranged on the power supply mounting member, a mounting part is arranged on one side of the power supply component mounting groove, and a position of the lock fixing part corresponds to a position of the mounting part; and/or, the power supply mounting member is provided with a clamping notch and the cover body is provided with a clamping platform, or the cover body is provided with the clamping notch and the power supply mounting member is provided with the clamping platform; and the clamping platform is engaged with the clamping notch.

7. An LED display panel, comprising:

a main frame made of a lightweight material, wherein the main frame comprises a first end surface for mounting a display screen and a second end surface opposing the first end surface;

a supporting component, wherein the supporting component comprises a supporting tube and a plurality of supporting members; a plurality of fixing parts are arranged on peripheral edges of the second end surface, and the plurality of supporting members are mounted on the plurality of fixing parts corresponding to the plurality of supporting members; a tube fixing part is arranged on an end of the supporting member, wherein the end of the supporting member is far away from the second end surface, and the supporting tube is fixed on the tube fixing part; and a control box, wherein a power supply, a control system and a signal transmission system are arranged in the control box, and the control system and the signal transmission system are electrically connected to the power supply; and the control box is mounted on the second end surface;

wherein a lock fixing component is arranged on the control box, and the lock fixing component comprises a female socket and a male plug; the male plug is mounted on the control box, and the female socket is mounted on the main frame; and/or, the female socket is provided with a spiral track groove, and the male plug is provided with a latch cooperating with the spiral tack groove; when the control box is mounted on the main frame, the latch moves along the spiral track groove and is clamped in the spiral track groove; and/or, the spiral track groove comprises a starting segment, a connection segment and an ending segment; the starting segment is arranged along an axial direction of the female socket, the ending segment is parallel to an end surface of the female socket, and the connection segment is connected between the starting segment and the ending segment; and/or, a clamping platform is arranged at a connection portion of the connection segment and the ending segment to enable the latch to be clamped between an end of the ending segment and the clamping platform, wherein the end of the ending segment is far away from the clamping platform.

8. An LED display panel, comprising:

a main frame made of a lightweight material, wherein the main frame comprises a first end surface for mounting a display screen and a second end surface opposing the first end surface;

a supporting component, wherein the supporting component comprises a supporting tube and a plurality of supporting members; a plurality of fixing parts are arranged on peripheral edges of the second end surface, and the plurality of supporting members are mounted on the plurality of fixing parts corresponding to the plurality of supporting members; a tube fixing part is arranged on an end of the supporting member, wherein the end of the supporting member is far away from the second end surface, and the supporting tube is fixed on the tube fixing part; and a control box, wherein a power supply, a control system and a signal transmission system are arranged in the control box, and the control system and the signal transmission system are electrically connected to the power supply; and the control box is mounted on the second end surface;

wherein an angle adjuster and a lock fastening component are arranged on the main frame, and the angle adjuster and the lock fastening component are mounted on two opposing sides of the main frame, respectively; and/or, the angle adjuster comprises a mounting base and an adjusting block, and the adjusting block is mounted on the main frame through the mounting base; the lock fastening component comprises a fixing base and a handle component, wherein the handle component is configured to cooperate with the adjusting block, and the handle component is mounted on the main frame through the fixing base; a position of the fixing base corresponds to a position of the mounting base.

9. The LED display panel of claim 8, wherein the adjusting block comprises:
 a first side surface, wherein the first side surface is located at a first side of the adjusting block and the first side surface is a quarter arc surface;
 a second side surface, wherein the second side surface is located at a second side of the adjusting block and the second side surface is a quarter arc surface;
 a curved surface structure, wherein the curved surface structure is connected between an arc edge of the first side surface and an arc edge of the second side surface; and
 an end surface structure, wherein the end surface structure is connected between a right-angle side of the first side surface and a right-angle side of the second side surface, and the end surface structure is provided with a connection part cooperating with the handle component.

10. The LED display panel of claim 9, wherein the mounting base is provided with a movable cavity adapted to the adjusting block; the angle adjuster further comprises an adjusting handle; the adjusting handle passes through the mounting base and then is connected to the adjusting block mounted in the movable cavity to adjust a rotation angle of the adjusting block relative to the mounting base; and/or, the curved surface structure is provided with a perforation, and the mounting base is provided with an adjusting hole; the adjusting handle comprises a first lock rod and a first lock handle; a first end of the first lock rod passes through the adjusting hole and then extends out of the adjusting hole, and a second end of the first lock rod passes through the perforation and then is fixed through a clamping ring; the first lock handle is mounted on the first end of the first lock rod to adjust a position of the adjusting block in the movable cavity.

11. The LED display panel of claim 10, wherein the adjusting hole is formed by sequentially connecting two through holes with different diameters; the first lock rod comprises a third end and a fourth end, wherein a diameter of the third end of the first lock rod is larger than a diameter of the fourth end of the first lock rod, the diameter of the third end of the first lock rod and the diameter of the fourth end of the first lock rod match the two through holes; the adjusting handle further comprises:
 an elastic member, wherein a first end of the elastic member abuts against the clamping ring, and a second end of the elastic member abuts against the curved surface structure; and the third end of the first lock rod is clamped on the adjusting hole under an action of the elastic member, and the fourth end of the first lock rod is movable in the adjusting hole under the action of the elastic member.

12. The LED display panel of claim 9, wherein a pin hole is arranged on both sides of the mounting base, respectively; the angle adjuster further comprises a positioning pin; the positioning pin passes through the pin hole and is mounted on the adjusting block; the adjusting block rotates along the pin hole through the positioning pin; and/or, the handle component further comprises a second lock rod and a second lock handle; the second lock rod comprises a lock rod body and a rotating shaft; the lock rod body penetrates through the rotating shaft, and the rotating shaft is mounted on the main frame through the fixing base; the second lock handle is fixedly connected to the lock rod body to drive the lock rod body to move back and forth along an axial direction of the rotating shaft.

13. The LED display panel of claim 12, wherein the lock rod body comprises a screw shaft, the screw shaft is arranged along the axial direction of the rotating shaft, the rotating shaft is provided with a screw hole matching the screw shaft, and the screw shaft is rotatably mounted in the screw hole through the second lock handle; and/or, the rotating shaft is provided with a ratchet wheel, the second lock handle is provided with a ratchet pawl, and the ratchet pawl cooperates with the ratchet wheel to limit a rotation direction of the second lock handle; and/or, the second lock handle is further provided with a control member, and the control member is connected to the ratchet pawl to control connection or disconnection of the ratchet pawl and the ratchet wheel.

* * * * *